United States Patent
Chuang et al.

(10) Patent No.: US 11,635,793 B2
(45) Date of Patent: Apr. 25, 2023

(54) FAN TYPE IDENTIFICATION APPARATUS AND METHOD

(71) Applicant: LENOVO ENTERPRISE SOLUTIONS (SINGAPORE) PTE. LTD., Singapore (SG)

(72) Inventors: Ming Chang Chuang, Taoyuan (TW); Jui-Chan Fan, New Taipei (TW); Yuhung Wang, Tainan (TW); Chenwei Lee, New Taipei (TW); Edward Yu-Chen Kung, New Taipei (TW)

(73) Assignee: LENOVO ENTERPRISE SOLUTIONS (SINGAPORE) PTE. LTD., Singapore (SG)

( * ) Notice: Subject to any disclaimer, the term of this patent is extended or adjusted under 35 U.S.C. 154(b) by 406 days.

(21) Appl. No.: 16/867,982

(22) Filed: May 6, 2020

(65) Prior Publication Data

US 2020/0356150 A1   Nov. 12, 2020

(30) Foreign Application Priority Data

May 7, 2019 (CN) .......................... 201910375064.2

(51) Int. Cl.
*G06F 1/20* (2006.01)
*H03K 7/08* (2006.01)
*H05K 7/20* (2006.01)

(52) U.S. Cl.
CPC ................ *G06F 1/206* (2013.01); *G06F 1/20* (2013.01); *H03K 7/08* (2013.01); *H05K 7/20172* (2013.01); *H05K 7/20209* (2013.01)

(58) Field of Classification Search
CPC .. G06F 1/20; G06F 1/206; H03K 7/08; H05K 7/20172; H05K 7/20209
See application file for complete search history.

(56) References Cited

U.S. PATENT DOCUMENTS

| | | | |
|---|---|---|---|
| 2007/0019383 A1* | 1/2007 | Chang ................ | H05K 7/20209 361/695 |
| 2008/0093458 A1* | 4/2008 | Pearce ............... | H05K 7/20836 415/13 |
| 2014/0028292 A1* | 1/2014 | Huang .................... | G01P 3/489 324/166 |
| 2017/0187310 A1* | 6/2017 | Hung ........................ | H02P 7/29 |

* cited by examiner

*Primary Examiner* — Mark A Connolly

(57) ABSTRACT

Systems, methods, apparatuses for fan type identification are disclosed. A predetermined pulse width modulation duty cycle is used to obtain a sequence of fan speeds from a fan over a time period. A fan type of the fan is determined based on the sequence of fan speeds.

16 Claims, 7 Drawing Sheets

900

Using a predetermined pulse width modulation duty to obtain a sequence of fan speeds
902

Determining a fan type of the fan based on the sequence of fan speeds
904

Fig. 9

FAN TYPE IDENTIFICATION APPARATUS AND METHOD

CROSS-REFERENCE TO RELATED APPLICATION

This application is a non-provisional application of and claims priority from Chinese Application Serial No. 201910375064.2, filed May 7, 2019, the contents of which are incorporated by reference herein in their entirety.

BACKGROUND

The capability to identify what kind of fan or a fan type of a fan can be useful, for example, to determine control parameters suitable for energy optimization. Fan type identification can be challenging as there are many and models of fans available in the market.

SUMMARY

An embodiment in accordance with the present disclosure is directed to a computing device including a controller coupled to a fan, wherein the controller is configured to use a predetermined pulse width modulation duty cycle to obtain a sequence of fan speeds from the fan over a time period, and to determine a fan type of the fan based on the sequence of fan speeds.

In one variation, the computing device includes a controller coupled to a fan, wherein the controller is configured to use a predetermined pulse width modulation duty cycle to obtain a sequence of fan speeds from the fan over a time period, and to determine a fan type of the fan based on the sequence of fan speeds, in which the sequence of fan speeds is obtained over a start-up time of the fan.

In another variation, the computing device includes a controller coupled to a fan, wherein the controller is configured to use a predetermined pulse width modulation duty cycle to obtain a sequence of fan speeds from the fan over a time period, and to determine a fan type of the fan based on the sequence of fan speeds, in which the sequence of fan speeds varies non-linearly over the start-up time.

In yet another variation, the computing device includes a controller coupled to a fan, wherein the controller is configured to use a predetermined pulse width modulation duty cycle to obtain a sequence of fan speeds from the fan over a time period, and to determine a fan type of the fan based on the sequence of fan speeds, in which the controller is further configured to set the predetermined pulse width modulation duty cycle at a duty cycle lower than a duty cycle within an operational pulse width modulation range.

In yet another variation, the computing device includes a controller coupled to a fan, wherein the controller is configured to set a predetermined pulse width modulation duty cycle at a duty cycle lower than a duty cycle within an operational pulse width modulation range, and in which the predetermined pulse width modulation duty cycle is set at below 10% duty cycle, to use the predetermined pulse width modulation duty cycle to obtain a sequence of fan speeds from the fan over a time period, and to determine a fan type of the fan based on the sequence of fan speeds; in which the controller is further configured to.

In yet another variation, the computing device includes a controller coupled to a fan, wherein the controller is configured to use a predetermined pulse width modulation duty cycle to obtain a sequence of fan speeds from the fan over a time period, to determine a fan type of the fan based on the sequence of fan speeds, to determine a plurality of fan speed samples from the sequence of fan speeds, each of the fan speed samples corresponding to a different sampling time, and to assign a corresponding code element to each of the fan speed samples, wherein the corresponding code element is one of a plurality of code elements, and wherein each of the plurality of code elements corresponds to one of a plurality of ranges of fan speeds.

In yet another variation, the computing device includes a controller coupled to a fan, wherein the controller is configured to use a predetermined pulse width modulation duty cycle to obtain a sequence of fan speeds from the fan over a time period, to determine a fan type of the fan based on the sequence of fan speeds, to determine a plurality of fan speed samples from the sequence of fan speeds, each of the fan speed samples corresponding to a different sampling time, and to assign a corresponding code element to each of the fan speed samples, wherein the corresponding code element is one of a plurality of code elements, wherein each of the plurality of code elements corresponds to one of a plurality of ranges of fan speeds, and wherein the computing device includes a memory storing a library of fan types and the controller is further configured to form a code using the corresponding code elements, and to use the code to look up a corresponding fan type in the library of fan types.

In yet another variation, the computing device includes a controller coupled to a fan, wherein the controller is configured to use a predetermined pulse width modulation duty cycle to obtain a sequence of fan speeds from the fan over a time period, to determine a fan type of the fan based on the sequence of fan speeds, to determine a plurality of fan speed samples from the sequence of fan speeds, each of the fan speed samples corresponding to a different sampling time, and to assign a corresponding code element to each of the fan speed samples, wherein the corresponding code element is one of a plurality of code elements, wherein each of the plurality of code elements corresponds to one of a plurality of ranges of fan speeds, and wherein controller is configured to form a code by combining the corresponding code elements in a sequence.

Another embodiment in accordance with the present disclosure is directed to a method of fan type identification that includes using a predetermined pulse width modulation duty cycle to obtain a sequence of fan speeds from a fan over a time period, and determining a fan type of the fan based on the sequence of fan speeds.

In one variation, the method includes using a predetermined pulse width modulation duty cycle to obtain a sequence of fan speeds from a fan over a time period, determining a fan type of the fan based on the sequence of fan speeds, and obtaining the sequence of fan speeds over a start-up time of the fan.

In another variation, the method includes using a predetermined pulse width modulation duty cycle to obtain a sequence of fan speeds from a fan over a time period, and determining a fan type of the fan based on the sequence of fan speeds, wherein sequence of fan speeds varies non-linearly over the start-up time.

In yet another variation, the method includes setting a predetermined pulse width modulation duty cycle at a duty cycle lower than a duty cycle within an operational pulse width modulation range, using the predetermined pulse width modulation duty cycle to obtain a sequence of fan speeds from a fan over a time period, and determining a fan type of the fan based on the sequence of fan speeds.

In yet another variation, the method includes setting a predetermined pulse width modulation duty cycle at a duty cycle lower than a duty cycle within an operational pulse width modulation range, wherein the predetermined pulse width modulation duty cycle is set at below 10% duty cycle, using the predetermined pulse width modulation duty cycle to obtain a sequence of fan speeds from a fan over a time period, and determining a fan type of the fan based on the sequence of fan speeds.

In yet another variation, the method includes using a predetermined pulse width modulation duty cycle to obtain a sequence of fan speeds from a fan over a time period, determining a fan type of the fan based on the sequence of fan speeds, determining a plurality of fan speed samples from the sequence of fan speeds, each of the fan speed samples corresponding to a different sampling time, and assigning a code element to each of the fan speed samples, wherein the assigned code element is one of a plurality of code elements, and wherein each of the plurality of code elements corresponds to one of a plurality of ranges of fan speeds.

In yet another variation, the method includes using a predetermined pulse width modulation duty cycle to obtain a sequence of fan speeds from a fan over a time period, determining a fan type of the fan based on the sequence of fan speeds, determining a plurality of fan speed samples from the sequence of fan speeds, each of the fan speed samples corresponding to a different sampling time, and assigning a code element to each of the fan speed samples, wherein the assigned code element is one of a plurality of code elements, wherein each of the plurality of code elements corresponds to one of a plurality of ranges of fan speeds, and wherein the method further includes forming a code using the assigned code elements; and using the code to look up a corresponding fan type in a library of fan types.

In yet another variation, the method includes using a predetermined pulse width modulation duty cycle to obtain a sequence of fan speeds from a fan over a time period, determining a fan type of the fan based on the sequence of fan speeds, determining a plurality of fan speed samples from the sequence of fan speeds, each of the fan speed samples corresponding to a different sampling time, and assigning a code element to each of the fan speed samples, wherein the assigned code element is one of a plurality of code elements, wherein each of the plurality of code elements corresponds to one of a plurality of ranges of fan speeds, and wherein the method further includes forming a code by combining the assigned code elements in a sequence in order of the sampling time, in which the code corresponds to a fan type.

BRIEF DESCRIPTION OF THE DRAWINGS

FIG. 9 sets forth a flowchart illustrating a method of fan type identification according to an embodiment.

DETAILED DESCRIPTION

Figure 1:
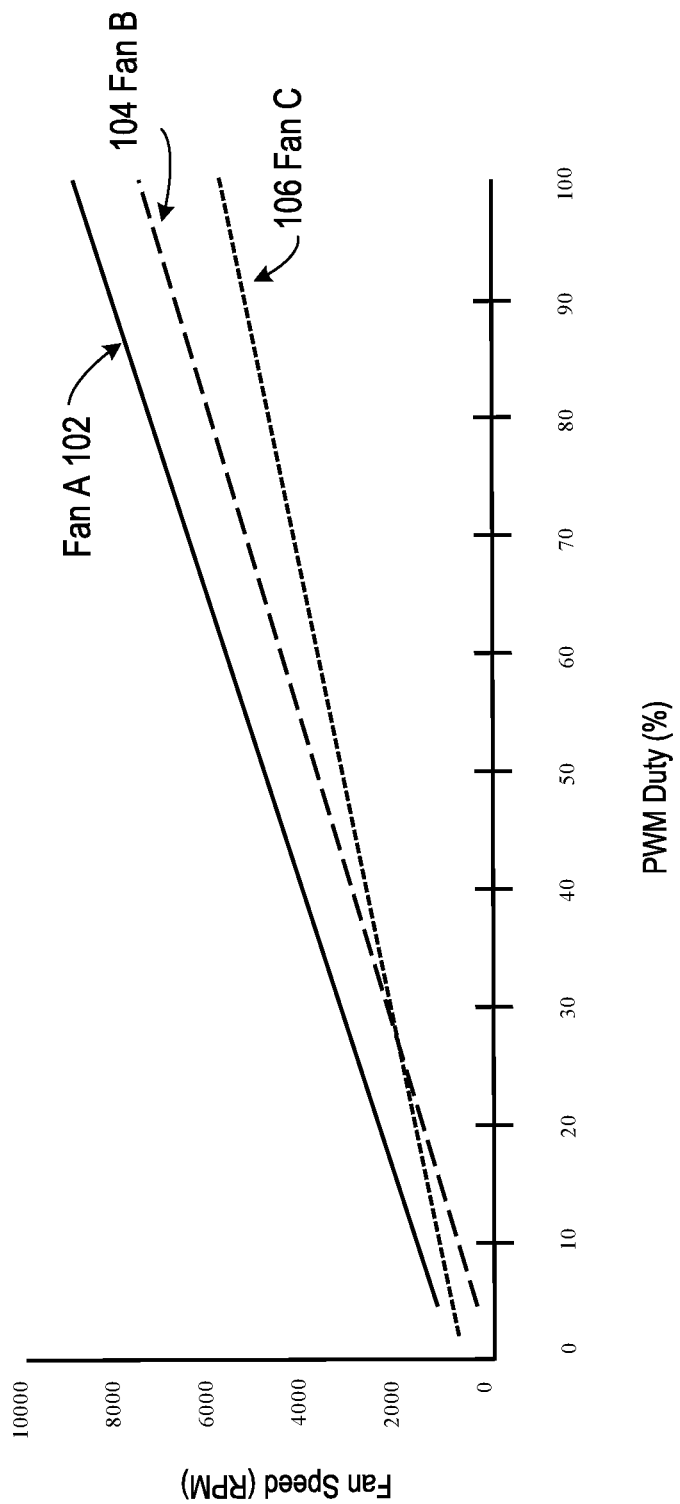
FIG. 1 shows a plot of fan speed against pulse with modulation (PWM) duty cycle for three fans.

It will be readily understood that the components of the embodiments, as generally described and illustrated in the figures herein, may be arranged and designed in a wide variety of different configurations in addition to the described example embodiments. Thus, the following more detailed description of the example embodiments, as represented in conjunction with the figures, is not intended to limit the scope of the embodiments, as claimed, but is merely representative of example embodiments.

Reference throughout this specification to "one embodiment", "another embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment.

Furthermore, the described features, structures, or characteristics may be combined in any suitable manner in one or more embodiments. In the following description, numerous specific details are provided to give a thorough understanding of embodiments. One skilled in the relevant art will recognize, that the various embodiments be practiced without one or more of the specific details, or with other methods, components, materials, etc. In other instances, some or all known structures, materials, or operations may not be shown or described in detail to avoid obfuscation.

In this disclosure, a fan type of a fan refers to a category under which the fan may be categorized or classified. Fans may be categorized by one or more characteristics or features, for example, by the fan's model number, the fan's manufacturer, the brand, the fan's rated performance, etc., or any combination thereof. Identifying the fan type can be understood to include identifying the category of the fan and/or the fan-coupled apparatus or system. For example, identifying the fan type may include identifying whether the fan is a high-performance fan or a standard-performance fan. Identifying the fan type may be related to determining a set of parameters suitable for operating a computing device or a fan coupled to the computing device. Identifying the fan type may be useful for selecting and/or applying a set of parameters intended to optimize energy usage, heat dissipation, and/or such conditions in relation to a system having at least one computing device, such as a server. Identifying the fan type may involve identifying the supplier of the fan to facilitate quality assurance. In the present disclosure, references to identification of the fan type of a fan includes determining a category of the fan, and it can also include determining an identifier, a name, or a descriptor associated with the category of the fan.

A fan may be provided as part of a computing device. The fan may be provided with a four-wire interface that includes a ground, a power line, a pulse width modulation (PWM) input, and a tachometer output. The fan is configured to receive a power supply regulated by pulse width modulation. This means that the operation or the performance of the fan may be controllable by varying the PWM duty cycle. For example, the fan speed of the fan may be regulated or controlled by varying the PWM duty cycle provided to the fan. For example, a 100% PWM duty cycle results in the power supply being provided non-intermittently or continuously to the fan. The resulting fan speed may be referred to as a maximum fan speed. When the PWM duty cycle is less than 100%, the power supply to the fan is intermittent or pulsed. The PWM duty cycle may thus be expressed in terms of a percentage of the maximum PWM duty cycle. For example, a PWM duty cycle of 75% will result in the power supply being provided to the fan for 75% of a duty cycle. In such a case, the power supply to the fan is pulsed or intermittent over time. The fan speed when the PWM duty cycle is 75% will therefore be proportionately lower than the maximum fan speed when the fan is in a normal operating mode. Within an operational PWM range, each PWM duty cycle that is provided to the motor via the PWM input causes the fan to operate at one fan speed. It can be appreciated that in the normal operating mode, the PWM is set to one duty cycle value within the operational PWM range, and the fan is designed to operate at one fan speed, so as to allow for control of the fan speed through adjusting the PWM duty cycle. The fan speed may be read by the controller from the tachometer output.

To further illustrate the relationship between the PWM duty cycle and the fan speed, FIG. 1 shows a graphical representation (102) of the fan speed of a Fan A over a range of PWM duty cycle. Also shown in FIG. 1 is a graphical representation (104) of the fan speed of a Fan B over a range of PWM duty cycle. Further shown in FIG. 1 is a graphical representation (106) of the fan speed of a Fan C over a range of PWM duty cycle. Within the operational PWM range, the fan speed increases as the PWM duty cycle increases. The fan speed and the PWM duty cycle may be said to exhibit a linear relationship over the operational PWM range. Considering the Fan A as an example, it can be seen that for each PWM duty cycle, there is only one fan speed associated with the PWM duty cycle. If a PWM of 100% duty cycle is provided to the Fan A, the Fan A operates at a fan speed of about 9000 revolutions per minute (RPM). If a PWM duty cycle of about 60% is provided to the Fan A, this means that the Fan A draws from the power supply for 60% of the time. The resultant fan speed of the Fan A is accordingly lower. In this example, the fan speed of the Fan A is about 5800 RPM. In reality, the actual fan speed of a fan can be found to vary within a tolerance range.

In the example, when the PWM duty cycle is 40%, the Fan A is designed to operate at a fan speed of about 4000 RPM, the Fan B is designed to operate at a fan speed of about 3000 RPM, and the Fan C is designed to operate at a fan speed of about 2900 RPM. Thus, if the same PWM duty cycle of 40% is provided to the fans, the Fan A may be recognized by virtue of its fan speed of about 4000 RPM. It may be difficult to confidently differentiate between the Fan B and the Fan C, even though the Fan B and the Fan C have been designed to operate at different fan speeds for the same PWM duty cycle. This can be illustrated by considering the possible actual fan speed of Fan B and the possible actual fan speed of the Fan C, for example, when both the Fan B and the Fan C are provided with the same PWM duty cycle of 40%. Assuming a fan speed tolerance of +/−200 RPM, the actual fan speed of the Fan B may be a value in a range from 2800 RPM to 3200 RPM. Assuming a fan speed tolerance of +/−300 RPM, the actual fan speed of the Fan C may be a value in a range from 2600 RPM to 3200 RPM. Therefore, if a fan is found to operate at a fan speed of 3000 RPM when the PWM duty cycle is 40%, it is still not clear whether the fan is Fan B or Fan C. To enable a differentiation between Fan B and Fan C in this manner, Fan B and Fan C may need to be designed to operate at significantly different fan speeds relative to the tolerances. However, this option may not be feasible. There will also be cases where it is desirable to differentiate between the Fan B and the Fan C although both are designed to operate at the same fan speed of 2000 RPM at the same PWM duty cycle of 25%, as shown in FIG. 1.

Figure 2:
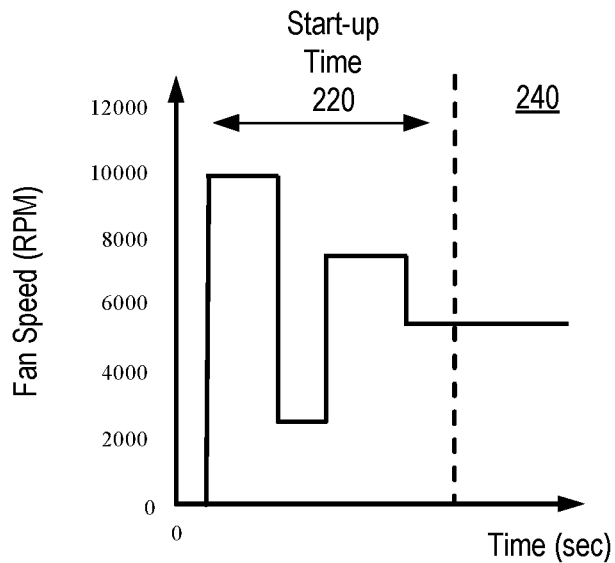
FIG. 2 shows an exemplary sequence of fan speeds over a time period, in accordance with an embodiment.
Figure 3:
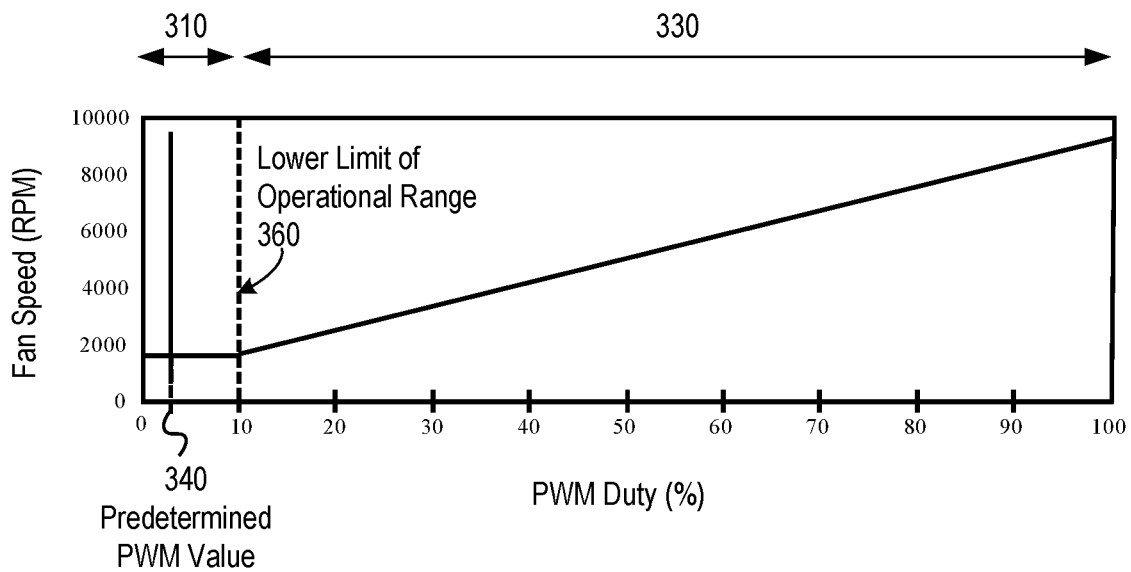
FIG. 3 is an example of a plot of fan speed against PWM duty cycle for a fan, in accordance with an embodiment.
Figure 7:
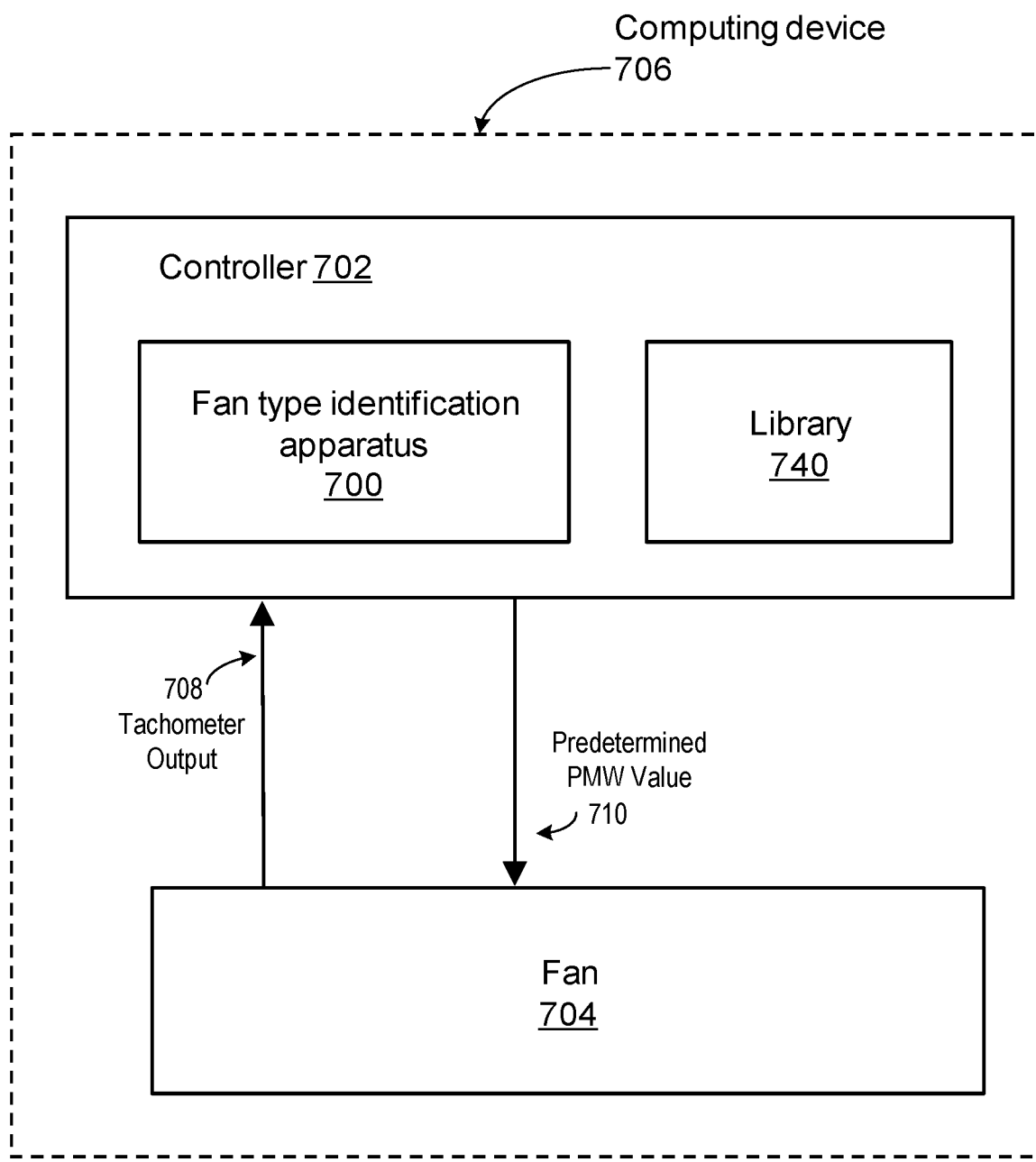
FIG. 7 sets forth a block diagram of an apparatus according to an embodiment.

With reference to FIG. 2 and FIG. 3, and in accordance with one aspect of the present disclosure, there is provided a computing device (e.g., the computing device (706) of FIG. 7) having a controller coupled to a fan, in which the controller is configured to use one predetermined PWM duty cycle (240) to obtain a sequence of fan speeds from the fan over a time period, and the controller is configured to determine a fan type of the fan based on the sequence of fan speeds. In other words, the present disclosure includes a computing device configured to use a predetermined PWM set at a duty cycle to obtain a sequence of fan speeds from the fan over a time period, and the computing device is configured to determine a fan type of the fan based on the sequence of fan speeds. The present disclosure includes a method of using a predetermined PWM set at a duty cycle to obtain a sequence of fan speeds from the fan over a time period, and determining a fan type of the fan based on the sequence of fan speeds.

In accordance with an embodiment, different fan types are associated with and/or provided with different sequences of fan speeds or different fan speed profiles. A fan type may be determined based on the sequence of fan speeds and/or fan speed profile. In a computing device having a controller coupled to a fan in accordance with the present disclosure, the controller is configured to provide a predetermined PWM duty cycle to the fan to obtain a sequence of fan speeds over a time period. The controller is further configured to determine a fan type of the fan based on the sequence of fan speeds. In other words, there is provided a computing device configured to provide a PWM set at a predetermined duty cycle to a fan to trigger a sequence of fan speeds over a time period, and the computing device is configured to determine a fan type of the fan based on the sequence of fan speeds. In a method of fan type identification in accordance with the present disclosure, the method includes providing a PWM set at a predetermined duty cycle to a fan to trigger a sequence of fan speeds over a time period, and determining a fan type of the fan based on the sequence of fan speeds.

References to a "sequence of fan speeds" as used in the present disclosure refer to a time series of fan speeds. The sequence of fan speeds may include a plurality of fan speeds in a time order. The sequence of fan speeds may also be described as a sequence of fan speeds over a period of time. The sequence of fan speeds may be described as a plurality of fan speeds ordered by time of occurrence. The sequence of fan speeds may also be described as a varying fan speed over time, and may be represented graphically by a graph (240) of fan speed against time, as shown in FIG. 2. It may also be represented as a collection of data indexed in order of time, for example, as a plurality of fan speeds indexed or ordered with respect to time. As shown in FIG. 2, the sequence of fan speeds provided in response to the one predetermined PWM duty cycle may vary non-linearly over the time period.

References to a "fan speed profile" in the present disclosure refers to a sequence of fan speeds characteristic of a (certain) fan type. A fan speed profile may refer to a pattern of a variation of fan speeds over time, associated with a fan type. A fan speed profile may be represented graphically by the graph of fan speed against time, as shown in FIG. 2. A fan speed profile may be represented as a collection of data indexed in order of time, for example, a fan speed profile may be represented as a plurality of fan speeds indexed or ordered with respect to time.

The controller may further include a library of fan speed profiles. A library of fan speed profiles refers to a collection or database including at least one fan speed profile. A library of fan speed profiles may be built from collecting different sequences of fan speeds from known fans of different fan types. Alternatively, the library of fan speed profiles may be built based on pre-determined fan speed profiles, each pre-assigned to a specific fan type, respectively.

The predetermined PWM duty cycle may be provided to the fan via the PWM input of the fan to trigger a provision of a sequence of fan speeds. For example, upon the controller providing a predetermined PWM duty cycle of 1%, the fan provides a sequence of fan speeds which is readable by the controller. In another example, upon the controller providing a predetermined PWM duty cycle of 5%, a sequence of fan speeds is provided to the controller. The predetermined PWM duty cycle may be a duty cycle outside the PWM operational range. Instead of one PWM duty cycle triggering a provision of one fan speed, one predetermined PWM duty cycle triggers a sequence of fan speeds. In FIG. 3, an indeterminate zone (310) represents a non-operational PWM range within which the predetermined PWM duty cycle may be set or selected. There may be a lower limit (360) of the operational PWM range (330) defined so that the predetermined PWM duty cycle can be a PWM duty cycle lower than the lower limit of the operational PWM range. The controller may be configured to set the predetermined PWM duty cycle at a value lower than a duty cycle of an operational PWM range. In this example, the predetermined PWM duty cycle may be set at below 10% duty cycle, while a PWM duty cycle above the lower limit of the operational PWM range can be used for setting the fan to achieve and operate at one fan speed.

The predetermined PWM duty cycle (340) may be provided over a start-up time 220 (see FIG. 2) of the fan. At the start-up time (220), the fan may be described as being in a start-up mode in which the fan speed is irregular or unstable, as the fan gets powered on and is settling into the normal operating mode (330). With reference to FIG. 2, the start-up time (220) is a time immediately following a powering on of the fan. In the example of FIG. 2, the start-up time is approximately 10 seconds, although the start-up time may differ from fan to fan. The start-up time or the start-up mode of the fan can be represented by the indeterminate zone (310) in the graph of fan speed against PWM duty cycle of FIG. 3. This is in contrast to the normal operating mode (330) in which the fan speed is approximately a linear function of the PWM duty cycle. In other words, during the start-up time (220), the relationship between the fan speed and the PWM duty cycle may not be as straightforward as a linear function, a monotonically increasing function or a monotonically decreasing function. For purposes of this disclosure, the function of the fan speed relative to time is described as a non-linear function.

The controller may be configured to provide the predetermined PWM duty cycle over the start-up time so that the fan type identification may occur concurrently or simultaneously with a start-up procedure of the fan or the computing device. That is to say, for example, the provision of predetermined PWM duty cycle may be concurrent or overlap the time in which the controller also performs the start-up procedure for the fan and/or the computing device. As an example, the controller may be configured such that the sequence of fan speeds is triggered in a start-up time. In another example, the controller may be configured such that the fan type is identified during the start-up time. This does not preclude the controller from using or controlling the fan at a time after the start-up time or after the start-up mode. For example, while at least a step in a fan type identification process occurs before the fan is in its normal operating mode, the fan type identified may be used to adjust the fan performance during the normal operating mode of the fan.

Figure 4:
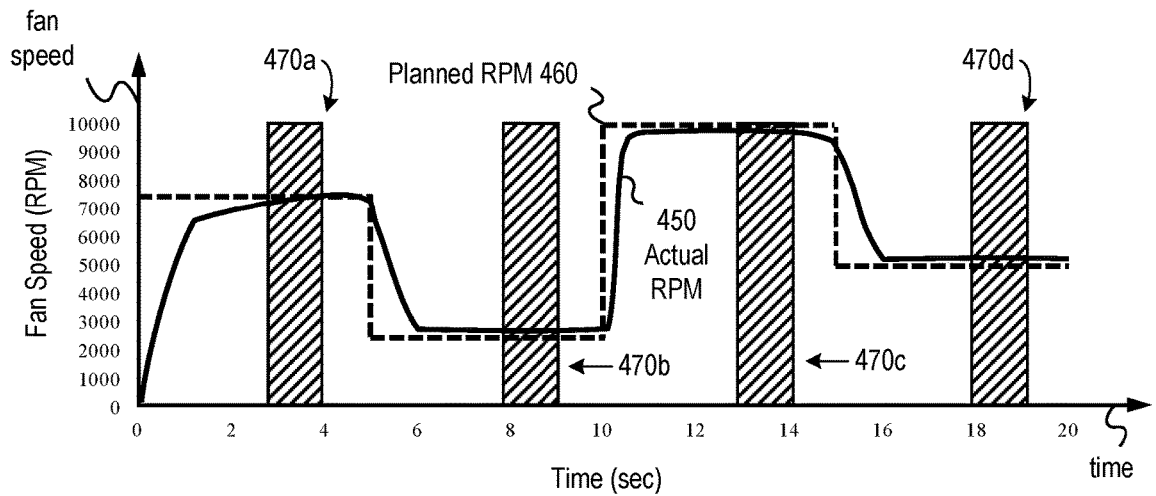
FIG. 4 shows a theoretical plot of a sequence of fan speeds and an actual plot of a sequence of fan speeds of a fan, according to one embodiment.

One example of a theoretical or ideal (planned) fan speed profile (460) is represented graphically as a plot of fan speed against time in FIG. 4. Further, against this is shown in FIG. 4 what an actual sequence (450) of fan speeds may look like in practice. A sequence of fan speeds provided obtained in response or upon being triggered by the predetermined PWM duty cycle is more likely to resemble the actual sequence of fan speeds than the theoretical model. Also shown in FIG. 4 are sampling times (470a-d) for sampling the sequence of fan speeds (450).

In this example, the start-up time is approximately 20 seconds from the time of powering on of the fan. It can also be said that the fan is in a start-up mode in the first 20 seconds from being powered on. In this example, the fan speed profile defines a fan speed of 7500 RPM for a first time period from 0 seconds to 5 seconds, followed by a fan speed of 2500 RPM for a second time period from 5 seconds to 10 seconds, followed by a fan speed of 10000 for a third time period from 10 seconds to 15 seconds, and followed by a fan speed of 5000 RPM for a fourth time period from 15 seconds to 20 seconds. However, while a theoretical or ideal fan speed profile may be designed with clearly defined transitions between adjacent time intervals, and to also clearly define a constant fan speed value at each time interval, in reality, an actual plot of the sequence of fan speeds is likely to be less clearly defined. There may be some speed losses and inefficiencies in the actual operation of a fan. As a result, different attempts to read the sequence of fan speeds from one same fan can result in different plots of the actual sequence of fan speeds against time. Solutions provided by embodiments of the present disclosure are capable of accommodating such variations from the theoretical plot to derive fan type based on e.g. the ranges of fan speeds instead of specific fan speed values. For this and other reasons, conventional fans are designed for use within the normal operating mode where conditions are more stable.

In accordance an embodiment, a controller is configured to use one predetermined PWM duty cycle to obtain a sequence (520) of fan speeds over a time period. The controller is further configured to determine a fan type of the fan based on the sequence of fan speeds. The controller may be further configured to determine a plurality of fan speed samples from the sequence of fan speeds, in which each of the fan speed samples corresponds to a different sampling time. The controller may be configured to assign a corresponding code element to each of the fan speed samples, in which the corresponding code element is one of a plurality of code elements. Each of the plurality of code elements corresponds to one of a plurality of ranges of fan speeds. This will be further described with reference to the example of FIG. 5.

Figure 5:
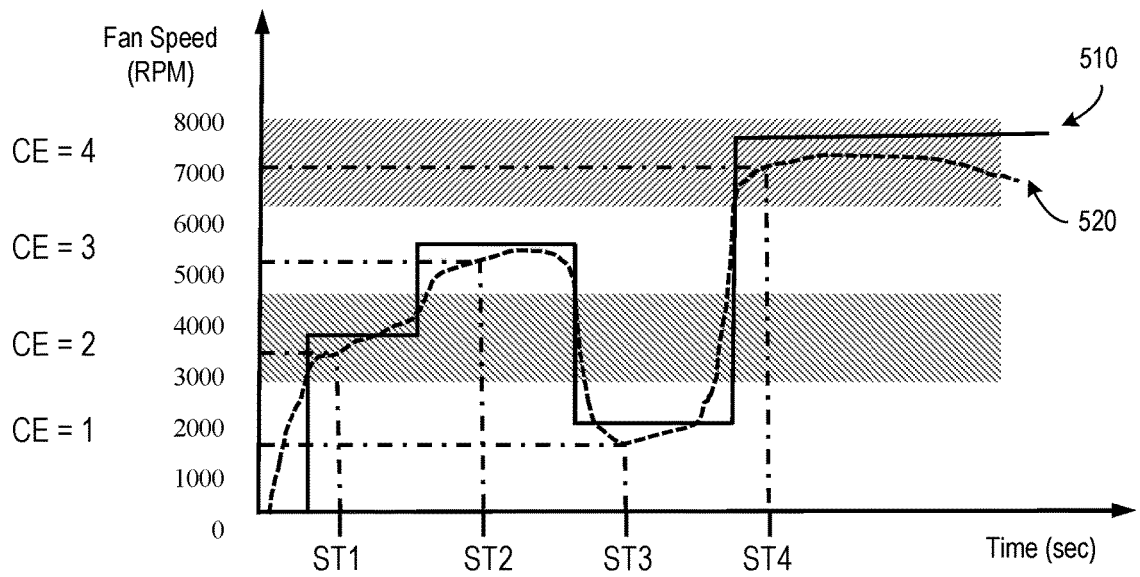
FIG. 5 sets forth an exemplary graph of fan speed sampling according to an embodiment.
Figure 5:
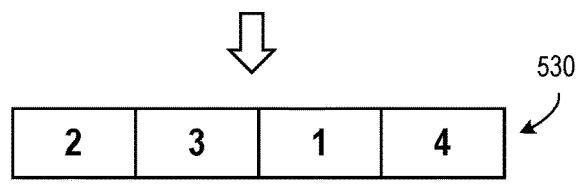

In the example of FIG. 5, the controller is configured to provide a plurality of ranges of fan speeds between a lower fan speed limit and an upper fan speed limit, e.g. between 0 RPM and 10000 RPM, based on the nominal speed characteristic parameters of a certain fan type as provided by the fan manufacturer. One of the ranges of fan speeds is a range from 0 RPM to 3200 RPM. Another of the ranges of fan speeds is a range from 3200 RPM to 5500 RPM. Yet another of the ranges of fan speeds is a range from 5500 RPM to 7800 RPM. Another of the ranges of fan speeds is a range from 7800 RPM to 10000 RPM. The ranges of fan speeds may be non-overlapping values. Each range of fan speeds may include a continuum of fan speeds. Each of the ranges of fan speeds is associated with one of a plurality of code elements. For example, the range of fan speeds from 0 RPM to 3200 RPM is associated with a corresponding code element (CE) equal to "1". The range of fan speeds from 3200 RPM to 5500 RPM is associated with a corresponding CE equal to "2". The range of fan speeds from 5500 RPM to 7800 RPM is associated with a corresponding CE equal to "3". The range of fan speeds from 7800 RPM to 10000 RPM is associated with a corresponding CE equal to "4". In this example, the possible fan speeds of the fan are grouped into four ranges of fan speeds only for the purpose of illustration. There may be different number of ranges of fan speeds. There may be as few as two ranges of fan speeds defined. There may be a plurality of ranges of fan speeds other than four ranges of fan speeds defined. The code elements used here are merely for the purpose of illustration. The code elements are not limited to those used in this example, and need not be numerical in nature. Each of the ranges of fan speeds are in one-to-one correspondence with respective ones of a plurality of code elements.

In the example of FIG. 5, the controller is further configured to select or determine a plurality of fan speed samples from the sequence of fan speeds. The controller in this example is configured to determine a fan speed sample at each of four different sampling times, and thus in total selecting four fan speed samples over time. Determining the fan speed samples may be performed for approximately equal sampling time durations. Alternatively, the sampling may be performed at predetermined sampling times that are not equal in duration. The sampling times may be equally spaced apart over time. Alternatively, the sampling times need not be equally spaced apart. In this example, a first fan speed sample (ST1), taken around time=3 seconds for a sampling time duration of about 1 second, is 4800 RPM. This fan speed is in the range of fan speeds associated with or corresponding to the code element "2". A second fan speed sample (ST2), taken around time=8 seconds for a sampling time duration of about 1 second, is 6500 RPM. This fan speed is in the range of fan speeds associated with or corresponding to the code element "3". A third fan speed sample (ST3), taken around time=13 seconds for a sampling time duration of about 1 second, is 2500 RPM. This fan speed is in the range of fan speeds associated with or corresponding to the code element "1". A fourth fan speed sample (ST4), taken around time=18 seconds for a sampling time duration of about 1 second, is 9500 RPM. This fan speed is in the range of fan speeds associated with or corresponding to the code element "4". A combination (530) of the code elements therefore yields: "2314". The controller may be configured to map or look up the combination of the corresponding code elements to the fan type in a library of fan types. The sequence of fan speeds "4800 RPM, 6500 RPM, 2500 RPM, 9500 RPM" may be stored in the controller. The combination of the code elements "2314" may be stored in the controller. The controller may be configured to retrieve the stored sequence of fan speeds or the stored combination of the corresponding code elements, and to perform the step of mapping or looking up the fan type in the library of fan types. The controller is thus configured to determine a fan type of the fan based on the combination of corresponding code elements, that is to say, the controller is configured to determine the fan type based on the sequence of fan speeds. The fan type that has been identified can be stored in the controller and/or used during the normal operating mode of the fan.

It can be appreciated that, in an ideal situation where the sequence of fan speeds is a theoretical sequence (510) of fan speeds or a designed sequence of fan speeds, the fan speed samples obtained would have been, in order of sampling time: 4500 RPM, 7000 RPM, 2300 RPM, and 9200 RPM. These theoretical fan speed samples would have yielded the same sequence of corresponding code elements of "2", :3", "1", and "4." The same combination of the corresponding code elements "2314" would have resulted. Thus, although the sequence of actual fan speeds differs from the theoretical or ideal case, the controller of the present embodiment may correctly derive the combination of corresponding code elements.

Conventionally, upon a PWM duty cycle given to a fan, the fan would be revving up from 0 RPM to the nominal fan speed corresponding to the PWM duty cycle. In contrast, the example here shows that, for the embodiment of the present disclosure, the sequence of fan speeds triggered by the predetermined PWM duty cycle need not be a series of fan speeds with increasingly larger fan speed values over time.

In this example, the controller is configured to select four fan speed samples merely for the purpose of illustration. The controller may be configured to select a different number of fan speed samples. It can be understood that the number of samples of fan speeds may vary from case to case.

In other words, the range of possible fan speeds is categorized into groups or bands, each group or each band being a range of fan speeds, and the groups or bands do not overlap in fan speeds. Each band is assigned a code element. Each of the fan speed samples can thus be mapped to a corresponding code element. The controller may be configured with rules for devising a combination of the corresponding code elements. In this example, the corresponding code elements are concatenated or linked in order of sampling time so as to form a string of code elements "2314", although the controller may be configured to combine the corresponding code elements according to other rules of combination.

The sample ranges of fan speeds in the present disclosure are given to aid understanding and should not be taken to be limiting. For example, the range of fan speeds in one band may vary from case to case. The range of fan speeds in one band or one range is defined with the fan speed tolerance in mind so that adjacent bands do not overlap. In one example, a band associated with a code element "0" is defined as 5000+/−1000 RPM and an adjacent band associated with a code element "1" is defined as 7000+/−1000 RPM. In another case, the band width of each band may be defined in terms of +/−600 RPM of a nominal fan speed. for example. In different applications, depending on factors such as the fan speed tolerances, the number of fan types that need to be provided for, etc., the controller may be configured to define the possible fan speeds into a different number of bands or ranges of fan speeds. Thus, defining four ranges of fan speeds as in FIG. 5 is only one example and given solely for the sake of illustration.

In a case where there are four sampling times, there can be as many as four corresponding code elements. Each code element can have as many possible values as there are number of ranges of fan speeds defined. In the example of FIG. 5, there is therefore a possibility to provide 4×4×4×4 permutations of code elements, i.e., to tag or identify as many as 256 distinct fan types. This potentially provides for the user to differentiate between 256 distinct fan types or categories, and is a significant improvement over the example of FIG. 1 where it can be difficult to make a distinction even between Fan B and Fan C.

Another embodiment of the present disclosure will be described with reference to FIG. 6. In this example, there is a fan type identification apparatus and a controller. The controller may be part of a computing device (e.g., the computing device (706) of FIG. 7). The controller can be coupled with a plurality of fans, including, e.g., Fan P, Fan Q, and Fan R.

The controller is configured to receive a sequence of fan speeds from the Fan P. The sequence of fan speeds is triggered in a start-up time of the Fan P in response to the Fan P receiving a predetermined PWM duty cycle. The controller is configured to receive a sequence of fan speeds from the Fan Q. The sequence of fan speeds is triggered in a start-up time of the Fan Q in response to the Fan Q receiving a predetermined PWM duty cycle. The controller is configured to receive a sequence of fan speeds from the Fan R. The sequence of fan speeds is triggered in a start-up time of the Fan R in response to the Fan R receiving a predetermined PWM duty cycle.

The predetermined PWM duty cycle provided to each fan may be one that is outside an operational PWM range of each fan respectively. In some fans, it may be desirable to avoid using a PWM duty cycle of 0%, or a PWM duty cycle between 0% and about 3% for example, as part of the operational PWM range. This could be due to thermal tolerance-related issues or other fan design considerations. In such cases, the fan may be designed with an operational PWM range between PWM duty cycle of 10% and PWM duty cycle of 100%. The predetermined PWM duty cycle can still be defined as a PWM duty cycle of 2%, lower than a lower limit of the operational PWM range of 10%. In other words, the predetermined PWM can be set at a duty cycle lower than a duty cycle within the operational PWM range.

The controller is configured to select a plurality of fan speed samples from the sequence of fan speeds from each of the fans, in which each of the fan speed samples is selected at a sampling time. From Fan P, the controller selected the fan speed samples (620) which includes fan P speed of 3000 RPM; 10000 RPM; 10000 RPM; and 7500 RPM. From Fan Q, the controller selected the fan speed samples (622) of: 2000 RPM; 9500 RPM; 9500 RPM; and 7000 RPM. From Fan R, the controller selected the fan speed samples (624) of: 7500 RPM; 2500 RPM; 12000 RPM; and 5000 RPM. This may involve the controller taking samples of the fan speeds as the sequence of fan speeds is being provided to the controller. The controller may be configured to take samples of the fan speed at sampling times that are spaced apart by time intervals.

The controller is further configured with a predefined plurality of ranges of fan speeds (626). Each band or each range of the ranges of fan speeds is associated with or corresponds to one of a plurality of code elements (636). The controller may be further configured to assign a corresponding code element to each of the fan speed samples, in which the corresponding code element is one of a plurality of code elements, and in which each of the plurality of code elements corresponds to one of a plurality of contiguous ranges of fan speeds. In the example of FIG. 6, the possible fan speeds receivable by the controller are grouped or banded into five ranges of fan speeds. Each range of fan speeds is associated with one of a plurality of code elements. The controller is configured to associate a fan speed sample falling within the range of fan speeds 2500+/−500 RPM to a code element "1". The controller is configured to associate a fan speed sample falling within the range of fan speeds 5000+/−500 RPM to a code element "2". The controller is configured to associate a fan speed sample falling within the range of fan speeds 7500+/−500 RPM to a code element "3". The controller is configured to associate a fan speed sample falling within the range of fan speeds 10000+/−500 RPM to a code element "4". The controller is configured to associate a fan speed sample falling within the range of fan speeds 12500+/−500 RPM to a code element "5". Thus, for Fan P, the controller assigns the corresponding code elements: "1", "4", "4", and "3". For Fan Q, the controller assigns the corresponding code elements: "1", "4", "4", and "3". For Fan R, the controller assigns the corresponding code elements: "3", "1", "5", and "2".

The controller is configured to devise a code for each sequence of fan speeds received from a fan. The controller is configured to form the code by combining the corresponding code elements in a sequence. The controller may be configured to devise the code as a combination of the corresponding code elements in order of the sampling times. In this example, the combination of corresponding code elements may be described as a "barcode" where code elements representing different values are arranged in a sequence so that collectively, the barcode or the combination of corresponding code elements can be used to represent data or information. In this document, "code" and "barcode" are thus used interchangeably.

In this example, the controller devises a barcode (640) from the code elements of Fan P so that Fan P is tagged by the barcode "1443." After the same manner, Fan Q is provided with the barcode (642) indicating the code element combination "1443." Fan R is provided with the barcode (646) indicating the code element combination "3152."

In accordance with the embodiment, the controller is provided with a library (628) of fan types. The controller is configured to map the combination of the corresponding code elements (652) to the fan type (650) in the library (628) of fan types. In other words, the controller may include a memory storing a library of fan types, and the controller is further configured to form a code using the corresponding code elements; and use the code to look up a corresponding fan type in the library of fan types. In this example, the controller is configured to look up the library for the fan type of a fan, using the barcode obtained for the fan. In the example of FIG. 6, as illustrated by the results table (670), the controller is able to determine that Fan P and fan Q are of the fan type "X", and to determine that Fan R is of the fan type "Z". This identification of the fan type can be done in the start-up time and the identified fan type can be stored in a controller and/or memory. The identified fan type can be retrieved from the controller and/or memory at a later time after the start-up time. The identified fan type can be retrieved from the controller and/or memory when the fan is in the normal operating mode. The controller begins a process of identifying the fan type during the start-up time, and when the fan type is identified, the identified fan type is stored for use after the start-up time.

Figure 6:
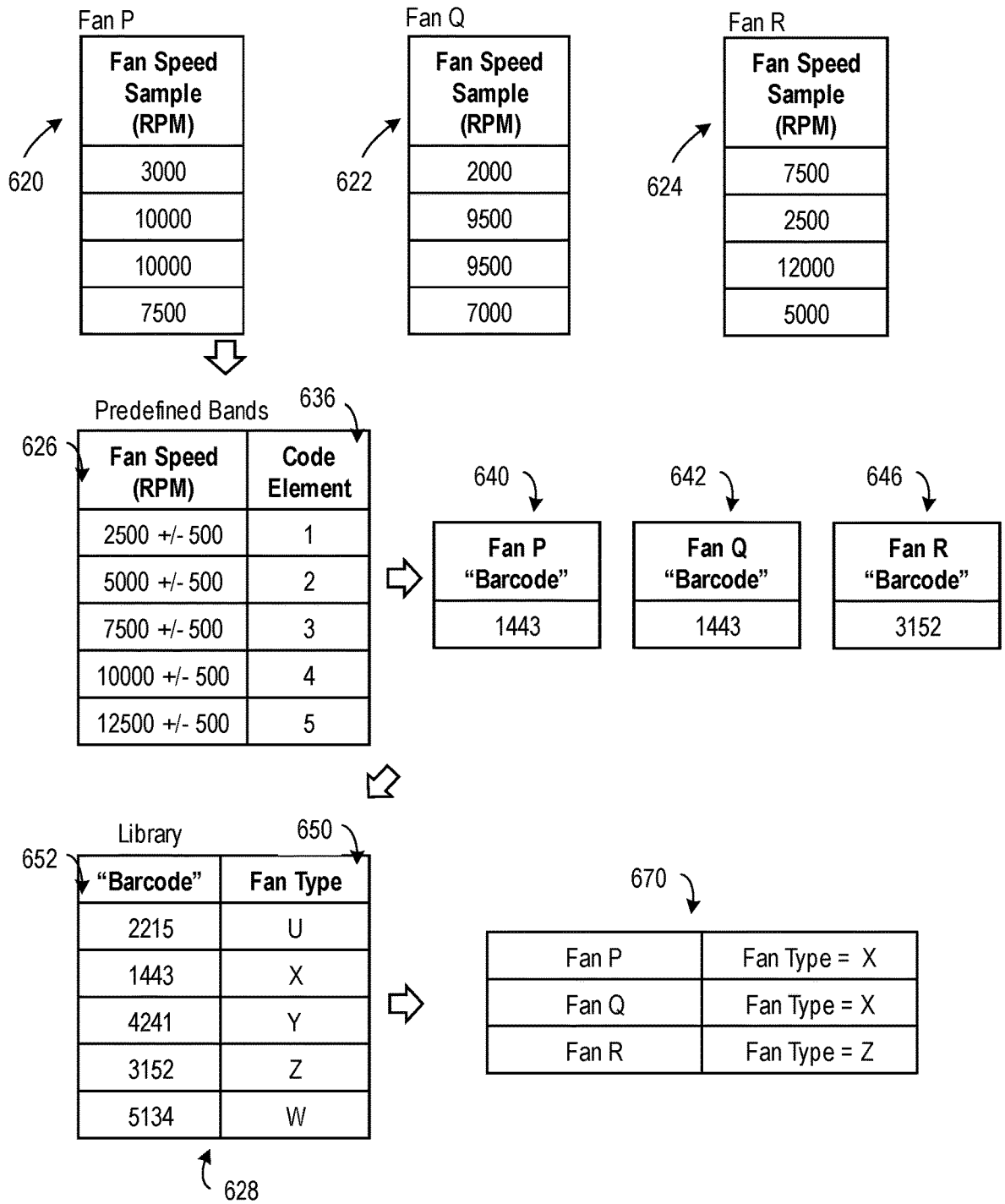
FIG. 6 sets forth a block diagram of a system according to an embodiment.

To aid understanding, FIG. 1 and FIG. 6 will now be used to illustrate another example in accordance with an embodiment of the present disclosure. In this example, Fan Q of FIG. 6 is configured to operate in the same manner as Fan B of FIG. 1, and Fan R of FIG. 6 is configured to operate in the same manner as Fan C of FIG. 1.

In response to Fan Q receiving the predetermined PWM duty cycle, it generates a sequence of fan speeds that is received by the controller of a computing device coupled to the Fan Q. The controller receives the sequence of fan speeds during the start-up time of the fan. The predetermined PWM duty cycle may be outside the operational PWM range of the Fan Q. The controller may have been configured with a predefined plurality of ranges of fan speeds, with each range of the ranges of fan speeds being associated with one of a plurality of code elements. The controller may select a plurality of fan speed samples from the sequence of fan speeds. For each of the fan speed samples, the controller may assign a code element by determining which of the ranges of fan speeds the respective fan speed sample falls within. The controller may then use a barcode devised from the code elements to determine a fan type of the Fan Q.

In this manner, Fan Q is tagged with the barcode "1443", and the fan type of Fan Q can be identified or determined to be "X". Following a similar method, Fan R is tagged with the barcode "3152", and the fan type of Fan R can be identified or determined to be "Z". In this manner, Fan Q and Fan R may be differentiated from one another by their different fan types.

In accordance with the embodiment, Fan Q and fan R may be differentiated from one another by giving both Fan Q and Fan R just one PWM input in the form of a predetermined PWM duty cycle. This is an improvement over comparing their fan speeds over a range of operational PWM duty cycles as the solution shown by FIG. 1. Also, the present embodiment overcomes the difficulty of distinguishing Fan B and Fan C when their respective fan speeds are almost the same for the same PWM duty cycle in the operational PWM range. In FIG. 1, this would be the case when the PWM duty cycle is about 20% to 40%.

Thus, it can be appreciated that embodiments of the present disclosure enable the normal operating mode and the barcode to be defined independent of each other. Fans may be configured to operate differently within their respective normal operating mode and yet be provided with the same barcode without affecting the fan performance. There is also greater flexibility because the barcode need not be constrained by the designed fan performance or designed normal operating mode. For example, the Fan P of FIG. 6 may be configured to operate in the same manner as the Fan A of FIG. 1 when in the normal operating mode, while the Fan Q of FIG. 6 may be configured to operate in the same manner as the Fan B of FIG. 1 when in the normal operating mode.

It can also be seen from FIG. 6 that, in this example, the absolute fan speed values of the fan speed samples obtained from Fan P and Fan Q are different. This may be an example where Fan P and Fan Q are of different models and/or performance levels. This may alternatively be an example where the differences are the result of tolerance variations. Despite such differences, the same barcode can be obtained for Fan P and Fan Q. In this example, both Fan P and Fan Q are found to have the same barcode of "1443". This gives greater flexibility to the type of data or information that can be used for describing the fan type. It is thus possible to correctly identify the manufacturing site of Fan P and Fan Q, or to correctly identify that both Fan P and Fan Q were shipped out from the same site. The ability to make such a fan type identification may come in useful in some situations, for example, for the purpose of improving product traceability or quality assurance.

According to one embodiment of the present disclosure as shown schematically in FIG. 7, there is provided a fan type identification apparatus (700) included in a controller (702), in which the controller (702) is configured to receive a sequence of fan speeds (through the tachometer output (708)) from a fan (704) during a start-up time of the fan, where the sequence of fan speeds is triggered in response to the fan receiving one PWM duty cycle (through the PWM input (710)). In another embodiment, the fan type identification apparatus includes a controller configured to provide a predetermined PWM duty cycle to the fan over a start-up time to trigger a provision of a sequence of fan speeds; and determine a fan type of the fan based on the sequence of fan speeds. The controller (702) may be configured with the library of fan types (740), such as a memory programmable to store the library of fan types.

FIG. 7 can also illustrate schematically another embodiment in which the fan type identification apparatus is part of the controller, in which the controller is configured to receive a sequence of fan speeds from a fan during a start-up time of the fan, where the sequence of fan speeds is triggered in response to the fan receiving a PWM duty cycle. In another embodiment, the fan type identification apparatus is part of the controller, in which the controller is configured to provide a predetermined PWM duty cycle to the fan over a start-up time to trigger a provision of a sequence of fan speeds; and determine a fan type of the fan based on the sequence of fan speeds.

FIG. 7 can also illustrate schematically an embodiment in which the fan type identification apparatus (700) and the controller (702) are both part of a computing device (706). In the embodiments which can be schematically represented by FIG. 7, the controller (702) is coupled to a fan (704). The fan (7040) may be part of the computing device (706).

The controller may include a server board management controller (BMC). The fan type identification apparatus may include a field programmable gate array (FPGA). The fan type identification apparatus may include firmware forming part of the controller.

Figure 8:
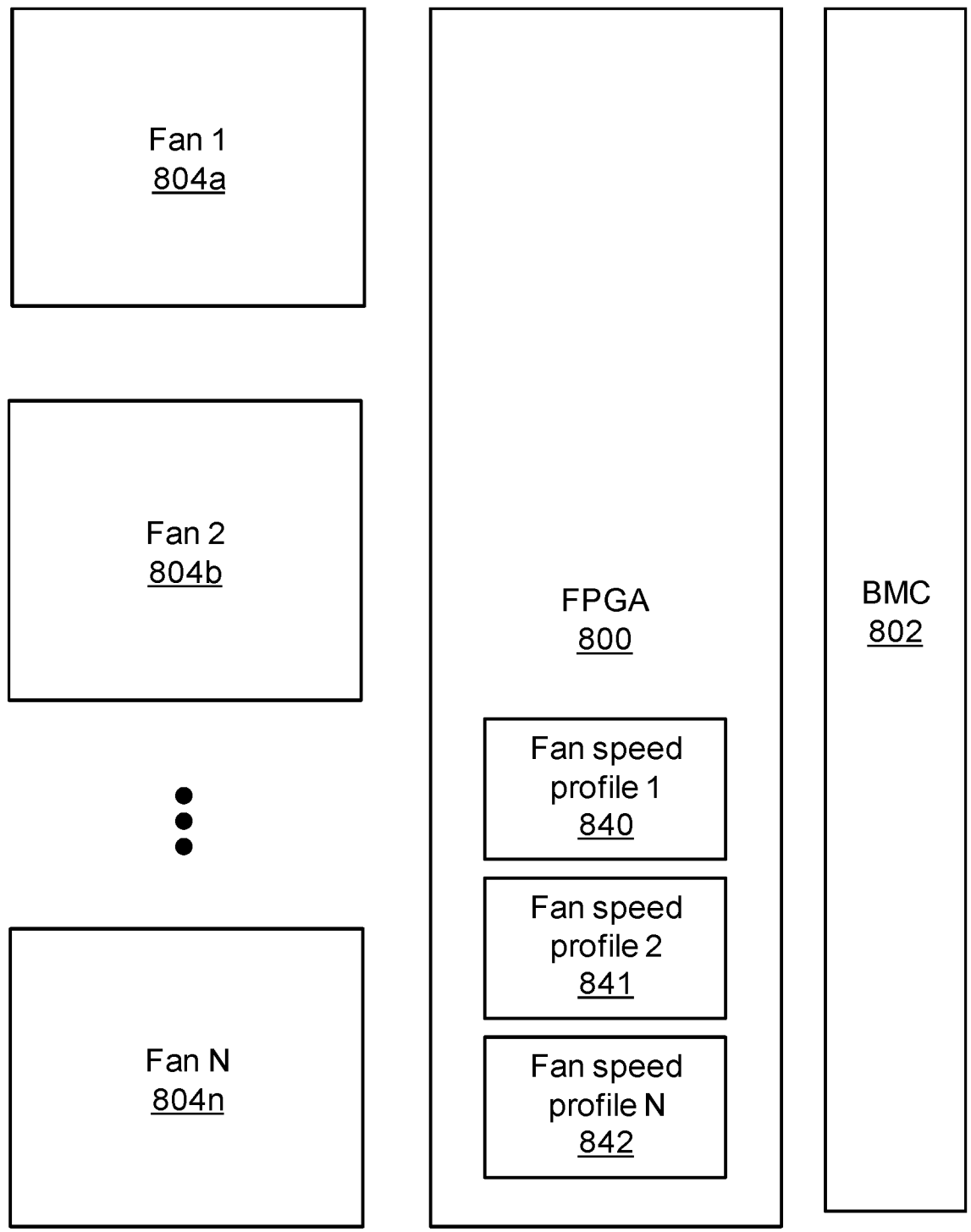
FIG. 8 sets forth a block diagram of an apparatus according to another embodiment.

As shown in FIG. 8, a computing device may include a plurality of fans (804a-n) coupled to a controller and/or a fan type identification apparatus, in which the controller is configured to provide a predetermined PWM duty cycle to the fan over a start-up time to trigger a provision of a sequence of fan speeds; and determine a fan type of the fan based on the sequence of fan speeds. FIG. 8 also schematically illustrates an embodiment in which a computing device includes a plurality of fans (804a-n) coupled to a controller and/or a fan type identification device, in which the controller is configured to receive a sequence of fan speeds from a fan during a start-up time of the fan, in which the sequence of fan speeds is triggered in response to the fan receiving a predetermined PWM duty cycle.

In the various embodiments described above, the controller may receive the sequence of fan speeds via a tachometer output (708) from the respective fan. It is thus not necessary to provide an additional read-out pin or connector that is dedicated for use in identifying the fan type. The predetermined PWM duty cycle may be provided to the respective fan outside the normal operating mode using the same wire for providing a PWM duty cycle to the fan during the normal operating mode. It is thus not necessary to provide an additional pin or connector dedicated to provide the fan with the predetermined PWM duty cycle.

Continuing with the example of FIG. 8, a controller may include a BMC (802) and an FPGA (800). The controller may be configured with the library of fan types (e.g., the library (740) of FIG. 7), such as a memory programmable to store the library of fan types. The fan types may be stored in the form of fan speed profiles (840, 841, 842). The library may store one or more fan types. The library may store at least one code or at least one barcode in relation to each of the fan types. To free up resources at the BMC, the fan type identification apparatus of the controller may be configured to run parallel with other start-up procedures managed by the BMC or another part of the controller.

There may be situations where a user has the option of selecting one fan from among many possible fans of potentially different fan types, such that it is not possible to know ahead of time which type of fan would be selected for use with a computing device. Yet, for improved energy efficiency, it would be preferred to be able to identify the fan type from among multiple possibilities, so that the appropriate operating parameters can be selected and applied. After the fan type of a fan has been determined in accordance with a method disclosed herein, the BMC can choose an appropriate fan table or an appropriate set of parameters for controlling the fan. In other embodiments, the controller may be configured to adaptively operate the fan type in response to the fan type. In some cases, it may be desirable to configure the controller to look up a library of fan control parameters. The fan type or barcode can be used to match or retrieve a corresponding set of fan control parameters for use in optimizing the fan performance or the for use in optimizing the computing device. In another application, the BMC can be configured to read the barcode of the fan from the fan type identification apparatus. With the barcode, the BMC can select a related fan table for managing or operating the fan so as to optimize the energy efficiency of a system of which the computing device forms a part.

Referring to FIG. 9, and in accordance with another embodiment of the present disclosure, there is provided a method (900) of fan type identification including using (902) a predetermined PWM duty cycle to obtain a sequence of fan speeds; and determining (904) a fan type of the fan based on the sequence of fan speeds.

As used herein, the singular "a" and "an" may be construed as including the plural "one or more" unless clearly indicated otherwise.

This disclosure has been presented for purposes of illustration and description but is not intended to be exhaustive or limiting. Many modifications and variations will be apparent to those of ordinary skill in the art. The example embodiments have been chosen and described in order to explain principles and practical application, and to enable others of ordinary skill in the art to understand the disclosure for various embodiments with various modifications as are suited to the particular use contemplated.

Thus, although illustrative example embodiments have been described herein with reference to the accompanying figures, it is to be understood that this description is not limiting and that various other changes and modifications may be effected therein by one of ordinary skill in the art without departing from the scope or spirit of the disclosure.

What is claimed is:

1. A computing device comprising:
a controller coupled to a fan and configured to:
use a predetermined pulse width modulation duty cycle to obtain a sequence of fan speeds from the fan over a time period; and
determine a fan type of the fan based on each of the fan speeds within the sequence of fan speeds.

2. The computing device of claim 1, wherein the sequence of fan speeds is obtained over a start-up time of the fan.

3. The computing device of claim 2, wherein the sequence of fan speeds varies non-linearly over the start-up time.

4. The computing device of claim 1, wherein the controller is further configured to set the predetermined pulse width modulation duty cycle at a value lower than that of an operational pulse width modulation range.

5. The computing device of claim 4, wherein the predetermined pulse width modulation duty cycle is set at below 10% duty cycle.

6. The computing device of claim 1, wherein the controller is further configured to:
determine a plurality of fan speed samples from the sequence of fan speeds, each of the fan speed samples corresponding to a different sampling time; and
assign a corresponding code element to each of the fan speed samples, in which the corresponding code element is one of a plurality of code elements, wherein each of the plurality of code elements corresponds to one of a plurality of ranges of fan speeds.

7. The computing device of claim 6, wherein the controller further comprises:
a memory storing a library of fan types, the controller being further configured to:
form a code using the corresponding code elements; and
use the code to look up a corresponding fan type in the library of fan types.

8. The computing device of claim 6, wherein the controller is further configured to form a code by combining the corresponding code elements in a sequence.

9. A method of fan type identification, the method comprising:
using a predetermined pulse width modulation duty cycle to obtain a sequence of fan speeds from a fan over a time period; and
determining a fan type of the fan based on each of the fan speeds within the sequence of fan speeds.

10. The method of claim 9 further comprising obtaining the sequence of fan speeds over a start-up time of the fan.

11. The method of claim 10, wherein the sequence of fan speeds varies non-linearly over the start-up time.

12. The method of claim 9 further comprising setting the predetermined pulse width modulation duty cycle at a duty cycle lower than a duty cycle within an operational pulse width modulation range.

13. The method of claim 12, wherein the predetermined pulse width modulation duty cycle is set at below 10% duty cycle.

14. The method of claim 9 further comprising:
determining a plurality of fan speed samples from the sequence of fan speeds, each of the fan speed samples corresponding to a different sampling time; and
assigning a code element to each of the fan speed samples, in which the assigned code element is one of a plurality of code elements, wherein each of the plurality of code elements corresponds to one of a plurality of ranges of fan speeds.

15. The method of claim 14 further comprising:
forming a code using the assigned code elements; and
using the code to look up a corresponding fan type in a library of fan types.

16. The method of claim 14 further comprising forming a code by combining the assigned code elements in a sequence in order of the sampling time, in which the code corresponds to a fan type.

* * * * *